(12) United States Patent
Takahashi et al.

(10) Patent No.: US 11,404,249 B2
(45) Date of Patent: Aug. 2, 2022

(54) SUBSTRATE PROCESSING APPARATUS

(71) Applicant: Tokyo Electron Limited, Tokyo (JP)

(72) Inventors: Shuichi Takahashi, Miyagi (JP);
Takaharu Miyadate, Miyagi (JP);
Takanori Banse, Miyagi (JP); Joji Takayoshi, Miyagi (JP); Rumiko Moriya, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 124 days.

(21) Appl. No.: 15/925,909

(22) Filed: Mar. 20, 2018

(65) Prior Publication Data

US 2018/0277416 A1    Sep. 27, 2018

(30) Foreign Application Priority Data

Mar. 22, 2017  (JP) .............................. JP2017-055977
Mar. 7, 2018   (JP) .............................. JP2018-041228

(51) Int. Cl.
*H01J 37/32* (2006.01)
*H01L 21/687* (2006.01)
(Continued)

(52) U.S. Cl.
CPC .. *H01J 37/32642* (2013.01); *H01J 37/32091* (2013.01); *H01L 21/67069* (2013.01);
(Continued)

(58) Field of Classification Search
CPC ......... H01J 37/32082–32182; H01J 37/32642; H01J 37/32651; H01J 37/32467–32513; H01J 37/32091; H01J 2237/334; H01L 21/683–6835; H01L 21/687–68792; H01L 21/67069; H01L 21/67109;
(Continued)

(56) References Cited

U.S. PATENT DOCUMENTS 5,304,248 A * 4/1994 Cheng ..................... C23C 16/04
                                                          118/728
6,328,808 B1 * 12/2001 Tsai .................. C23C 16/45521
                                                          118/500

(Continued)

FOREIGN PATENT DOCUMENTS

JP   H11-283967    10/1999
JP   2001-230239    8/2001
(Continued)

OTHER PUBLICATIONS

Johantgen, Speed-Torque Curves for Stepper Motors, Sep. 2, 2017 (Year: 2017).*
(Continued)

*Primary Examiner* — Benjamin Kendall
(74) *Attorney, Agent, or Firm* — IPUSA, PLLC (57) ABSTRACT

A substrate processing apparatus includes a process chamber, a stage that is disposed in the process chamber and on which a substrate is placeable, a moving mechanism, and a focus ring. The focus ring is disposed on the stage and includes an inner focus ring disposed close to the substrate placed on the stage, a middle focus ring that is disposed outside of the inner focus ring and is movable in a vertical direction by the moving mechanism, and an outer focus ring that is disposed outside of the middle focus ring.

25 Claims, 9 Drawing Sheets

US 11,404,249 B2
Page 2

(51) Int. Cl.
*H01L 21/683* (2006.01)
*H01L 21/67* (2006.01)

(52) U.S. Cl.
CPC ...... *H01L 21/6831* (2013.01); *H01L 21/6833* (2013.01); *H01L 21/68735* (2013.01); *H01L 21/68742* (2013.01); *H01L 21/68785* (2013.01); *H01J 2237/334* (2013.01); *H01L 21/67109* (2013.01)

(58) Field of Classification Search
CPC ........... H01L 21/6831; H01L 21/68735; H01L 21/68742; H01L 21/68785; C23C 16/0245; C23C 16/047
See application file for complete search history.

(56) References Cited

U.S. PATENT DOCUMENTS

| | | | |
|---|---|---|---|
| 2004/0129226 A1 | 7/2004 | Strang et al. | |
| 2005/0061447 A1* | 3/2005 | Kim | H01J 37/32642 156/345.51 |
| 2008/0236749 A1* | 10/2008 | Koshimizu | H01J 37/32642 156/345.33 |
| 2009/0071938 A1 | 3/2009 | Dhindsa et al. | |
| 2010/0147681 A1 | 6/2010 | Li et al. | |
| 2010/0294433 A1 | 11/2010 | Jianhui | |
| 2011/0100553 A1 | 5/2011 | Dhindsa et al. | |
| 2012/0175063 A1* | 7/2012 | Yamawaku | H01L 21/67069 156/345.46 |
| 2014/0017900 A1* | 1/2014 | Doba | H01L 21/68735 438/710 |
| 2014/0262026 A1* | 9/2014 | Forster | B05C 21/005 156/345.3 |
| 2014/0262763 A1 | 9/2014 | Rasheed et al. | |
| 2014/0273483 A1 | 9/2014 | Ge et al. | |
| 2016/0211166 A1 | 7/2016 | Yan et al. | |
| 2017/0213758 A1* | 7/2017 | Rice | H01J 37/32715 |
| 2018/0277416 A1 | 9/2018 | Takahashi et al. | |
| 2018/0315640 A1 | 11/2018 | Ueda et al. | |
| 2018/0358211 A1 | 12/2018 | Mun | |
| 2019/0326092 A1 | 10/2019 | Ogasawara et al. | |

FOREIGN PATENT DOCUMENTS

| | | |
|---|---|---|
| JP | 2008-244274 | 10/2008 |
| JP | 2009-044075 | 2/2009 |
| JP | 2012-222235 | 11/2012 |
| JP | 2015-023160 | 2/2015 |

OTHER PUBLICATIONS

ASM International Handbook Committee. (1998). ASM Handbook, vol. 07—Powder Metal Technologies and Applications. ASM International (Year: 1998).*

O'Mara, W.C. Herring, R.B. Hunt, L.P.. (1990). Handbook of Semiconductor Silicon Technology—6.5.7 Other Physical and Thermodynamic Properties. William Andrew Publishing/Noyes (Year: 1990).*

Johantgen (Speed—Torque Curves for Stepper Motors, 2017) (Year: 2017).*

* cited by examiner

SUBSTRATE PROCESSING APPARATUS

CROSS-REFERENCE TO RELATED APPLICATIONS

The present application is based upon and claims the benefit of priority of Japanese Patent Application No. 2017-055977 filed on Mar. 22, 2017 and Japanese Patent Application No. 2018-041228 filed on Mar. 7, 2018, the entire contents of which are incorporated herein by reference.

BACKGROUND OF THE INVENTION

1. Field of the Invention

An aspect of this disclosure relates to a substrate processing apparatus.

2. Description of the Related Art

A plasma etching apparatus includes a focus ring disposed along the circumference of a semiconductor wafer (which is hereafter referred to as a "wafer") (see, for example, Japanese Laid-Open Patent Publication No. 2008-244274). The focus ring has a function to control plasma near the circumference of the wafer and to improve the in-plane uniformity in the etching rate of the wafer.

The etching rate in an edge portion of the wafer changes depending on the height of the focus ring. For this reason, when the focus ring wears and the height of the focus ring changes, it becomes difficult to control the etching characteristic in the edge portion of the wafer. As a result, for example, the etching rate in the edge portion of the wafer becomes higher than the etching rate in a center portion and a middle portion of the wafer. In Japanese Laid-Open Patent Publication No. 2008-244274, a driving unit for moving the focus ring in the vertical direction is provided to control the position of the upper surface of the focus ring and to improve the controllability of the etching rate in the edge portion of the wafer.

The focus ring disclosed in Japanese Laid-Open Patent Publication No. 2008-244274 is a two-piece focus ring including a fixed inner focus ring and an outer focus ring that is movable in the vertical direction. With this configuration, when the outer focus ring is moved in the vertical direction, the etching rate in the entire wafer is shifted. Thus, with the configuration of Japanese Laid-Open Patent Publication No. 2008-244274, the etching characteristic in the entire wafer is changed, and it is difficult to control the etching characteristic only in the edge portion of the wafer.

SUMMARY OF THE INVENTION

In an aspect of this disclosure, there is provided a substrate processing apparatus that includes a process chamber, a stage that is disposed in the process chamber and on which a substrate is placeable, a moving mechanism, and a focus ring. The focus ring is disposed on the stage and includes an inner focus ring disposed close to the substrate placed on the stage, a middle focus ring that is disposed outside of the inner focus ring and is movable in a vertical direction by the moving mechanism, and an outer focus ring that is disposed outside of the middle focus ring.

DESCRIPTION OF THE PREFERRED EMBODIMENTS

Embodiments of the present invention are described below with reference to the accompanying drawings. Throughout the specification and the drawings, the same reference number is assigned to substantially the same components, and repeated descriptions of those components are omitted.

<<Substrate Processing Apparatus>>

Figure 1:
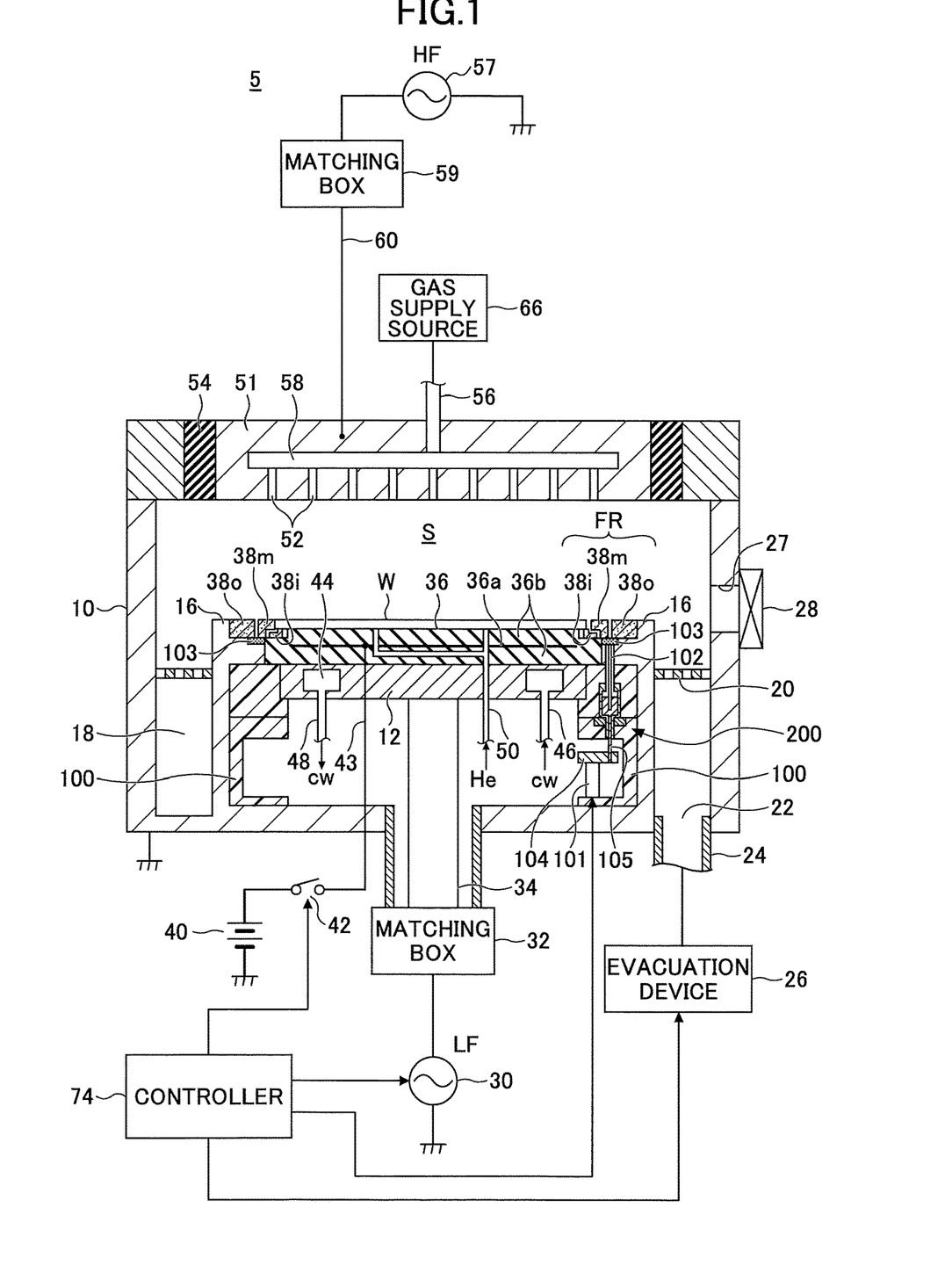
FIG. 1 is a drawing illustrating an example of a substrate processing apparatus according to an embodiment.

An example of a configuration of a substrate processing apparatus 5 according to an embodiment is described below with reference to FIG. 1. FIG. 1 illustrates an example of a configuration of the substrate processing apparatus 5. In the present embodiment, a parallel-plate capacitively-coupled plasma processing apparatus is used as an example of the substrate processing apparatus 5.

The plasma processing apparatus 5 includes a cylindrical vacuum chamber 10 comprised of a metal such as aluminum or stainless steel. The chamber 10 is an example of a process chamber where plasma processing is performed. The chamber 10 is grounded.

A discoidal stage 12 is disposed in the center of the bottom of the chamber 10. The stage 12 functions as a substrate holder on which an object such as a wafer W is placed and also functions as a lower electrode. The stage 12 is comprised of, for example, aluminum and is supported by a conductive cylindrical support 16 extending vertically upward from the bottom of the chamber 10 and by a housing 100 disposed adjacent to the inner surface of the conductive cylindrical support 16.

An annular evacuation channel 18 is formed between the conductive cylindrical support 16 and the inner wall of the chamber 10. An annular baffle board 20 is placed in the upper part or at the entry of the evacuation channel 18, and evacuation ports 22 are formed in the bottom of the evacuation channel 18. To make the flow of gas in the chamber 10 axisymmetric with respect to the wafer W on the stage 12, multiple evacuation ports 22 are preferably formed at regular intervals in the circumferential direction.

Each evacuation port 22 is connected via an evacuation pipe 24 to an evacuation device 26. The evacuation device 26 includes a vacuum pump such as a turbo molecular pump and can reduce the pressure in a plasma generation space S in the chamber 10 to a desired vacuum pressure. A gate valve 28 is attached to an outer side wall of the chamber 10. The gate valve 28 opens and closes a port 27 for carrying the wafer W into and out of the chamber 10.

A second high-frequency power supply 30 is electrically connected via a matching box 32 and a power feeder rod 34 to the stage 12. The second high-frequency power supply 30 can output a variable high-frequency power LF with a first frequency (e.g., 13.56 MHz) that is suitable to control the energy of ions drawn to the wafer W. The matching box 32 includes a reactance-variable matching circuit that matches the impedance on the side of the second high-frequency power supply 30 with the impedance on the side of the load (e.g., plasma).

An electrostatic chuck 36 for holding the wafer W with electrostatic attraction is provided on an upper surface of the stage 12. The electrostatic chuck 36 includes an electrode 36a made of a conductive film and a pair of insulating films 36b sandwiching the electrode 36a. A direct-current power supply 40 is electrically connected via a switch 42 and a coated wire 43 to the electrode 36a. The wafer W is attracted to and held on the electrostatic chuck 36 by an electrostatic force generated by a direct current supplied from the direct-current power supply 40.

An annular refrigerant flow path 44 extending along, for example, the circumferential direction is provided in the stage 12. A refrigerant such as cooling water cw with a predetermined temperature is supplied from a chiller unit via pipes 46 and 48 and circulated through the refrigerant flow path 44 to control the temperature of the wafer W on the electrostatic chuck 36 using the temperature of the refrigerant. Also, a heat transfer gas such as a He gas is supplied from a heat transfer gas supply via a gas supply pipe 50 to a space between the upper surface of the electrostatic chuck 36 and the lower surface of the wafer W. Pusher pins that pass through the stage 12 in the vertical direction and an elevation mechanism that moves the pusher pins in the vertical direction are provided to lift and lower the wafer W.

A gas shower head 51 is attached to the chamber 10 via a shield ring 54 covering the periphery of the gas shower head 51 so as to close an opening formed in the ceiling of the chamber 10. The gas shower head 51 is comprised of silicon. The gas shower head 51 also functions as an opposing electrode (upper electrode) that faces the stage 12 (lower electrode).

A gas inlet 56 for introducing a gas is formed in the gas shower head 51. A diffusion chamber 58 that branches from the gas inlet 56 is formed in the gas shower head 51. A gas output from a gas supply source 66 is supplied via the gas inlet 56 into the diffusion chamber 58. The gas is diffused in the diffusion chamber 58 and introduced into the plasma generation space S through a large number of gas holes 52 formed in the gas shower head 51.

A first high-frequency power supply 57 is electrically connected via a matching box 59 and a feeder line 60 to the gas shower head 51. The first high-frequency power supply 57 can output a variable high-frequency power HF with a second frequency (e.g., 40 MHz) that is higher than the first frequency and suitable for generating radio-frequency discharge plasma. The matching box 59 includes a reactance-variable matching circuit that matches the impedance on the side of the first high-frequency power supply 57 with the impedance on the side of the load (e.g., plasma).

A controller 74 includes, for example, a microcomputer and controls the operation of the entire substrate processing apparatus 5 and operations of respective components of the substrate processing apparatus 5. For example, components of the substrate processing apparatus 5 controlled by the controller 74 include the evacuation device 26, the first high-frequency power supply 57, the second high-frequency power supply 30, the matching box 32, the matching box 59, the switch 42 for the electrostatic chuck 36, the gas supply source 66, the chiller unit, and the heat transfer gas supply.

To perform processing such as etching with the substrate processing apparatus 5, the gate valve 28 is opened, and the wafer W is carried into the chamber 10 and placed on the electrostatic chuck 36. After the gate valve 28 is closed, gases are supplied from the gas supply source 66 into the chamber 10 at predetermined flow rates and flow ratios, and the pressure in the chamber 10 is decreased by the evacuation device 26 to a predetermined value. Also, the first high-frequency power supply 57 is turned on to output a high-frequency power HF for plasma generation with a predetermined power level, and the high-frequency power HF is supplied via the matching box 59 and the feeder line 60 to the gas shower head 51.

When applying a high-frequency power LF for controlling ion drawing, the second high-frequency power supply 30 is turned on to output a high-frequency power LF with a predetermined power level, and the high-frequency power LF is applied via the matching box 32 and the power feeder rod 34 to the stage 12. Also, a heat-transfer gas is supplied from the transfer-gas supply to a contact area between the electrostatic chuck 36 and the wafer W, and the switch 42 is turned on to apply the direct-current voltage from the direct-current power supply 40 to the electrode 36a of the electrostatic chuck 36 so that the transfer gas is trapped in the contact area by the electromagnetic attraction.

<Three-Piece Focus Ring>

An annular focus ring FR is provided on the outer periphery of the stage 12 so as to surround the outer edge of the wafer W. The focus ring FR has a function to control plasma near the outer circumference of the wafer W and to improve the in-plane uniformity in, for example, the etching rate of the wafer W.

The etching rate in the edge portion of the wafer W changes depending on the height of the focus ring FR. Accordingly, when the focus ring FR wears and the height of the focus ring FR changes, the etching rate in the edge portion of the wafer W changes and it becomes difficult to control the etching characteristic in the edge portion.

To prevent this problem, the focus ring FR of the present embodiment is implemented as a three-piece focus ring including an inner focus ring 38i, a middle focus ring 38m, and an outer focus ring 38o, and the middle focus ring 38m is configured to be movable in the vertical direction by a moving mechanism 200. The moving mechanism 200 includes a pusher pin 102. The pusher pin 102 is moved in the vertical direction by a piezo actuator 101 via a connecting part 104a and a coupling 105. As a result, a joint 103 moves in the vertical direction, and the middle focus ring 38m connected to the joint 103 moves in the vertical direction. In the present embodiment, the edge portion of the wafer W indicates a ring-shaped part having an inside radius of 140 mm and an outside radius of 150 mm from the center of the wafer W.

<Configuration of Focus Ring>

Next, configurations of the focus ring FR and components surrounding the focus ring FR are described with reference to FIG. 2 and FIGS. 3A through 3D. Also, movement of the middle focus ring 38m in the vertical direction is described with reference to FIG. 4.

Figure 2:
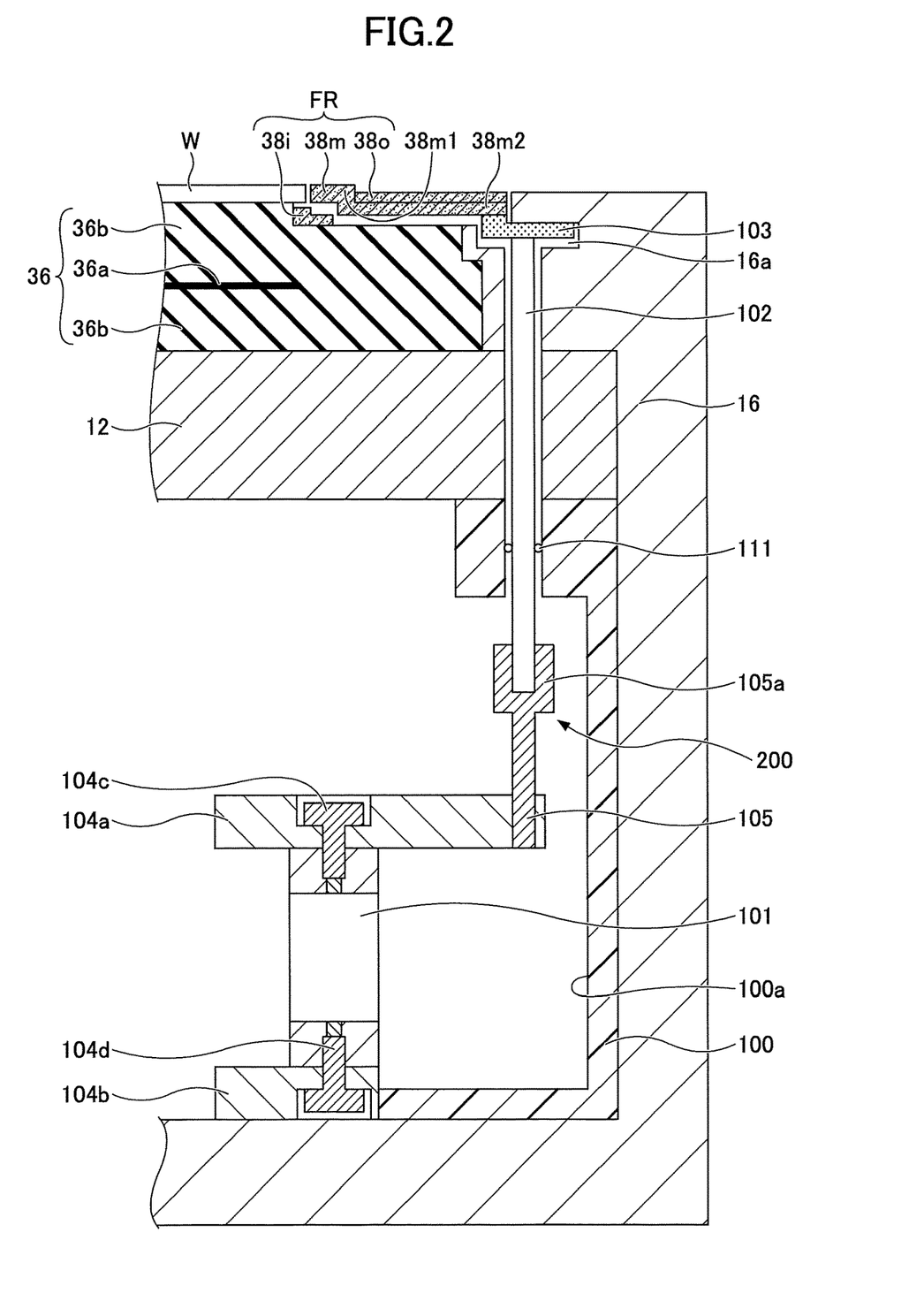
FIG. 2 is a drawing illustrating examples of a focus ring, a moving mechanism, and a driving unit according to an embodiment.

FIG. 2 is an enlarged vertical cross-sectional view of the focus ring FR and components surround the focus ring FR. FIG. 2 illustrates the focus ring FR, the moving mechanism 200, and the piezo actuator 101 according to the present embodiment.

Figure 3A:
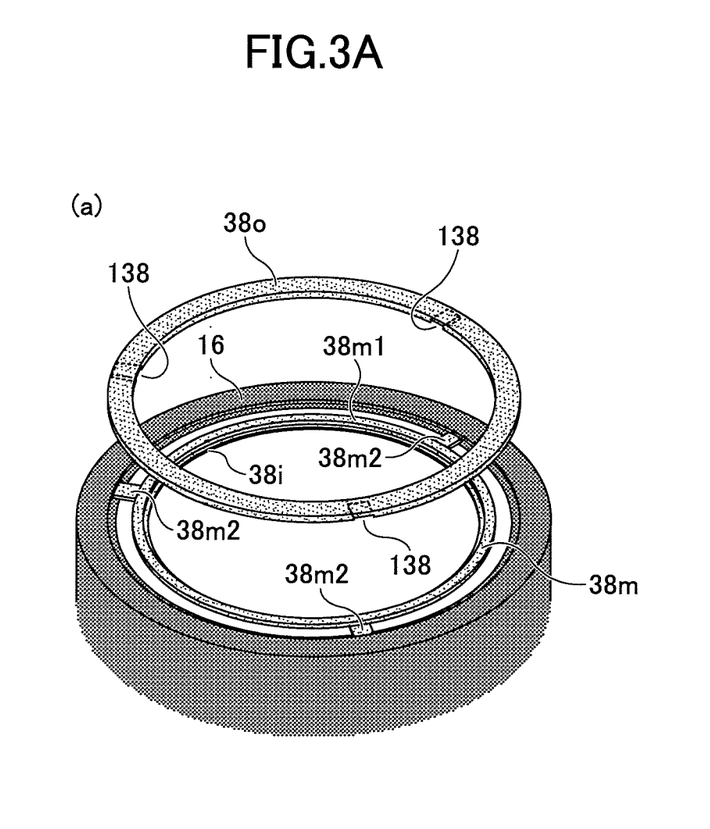
FIGS. 3A through 3D are drawings illustrating a three-piece focus ring according to an embodiment.
Figure 3B:
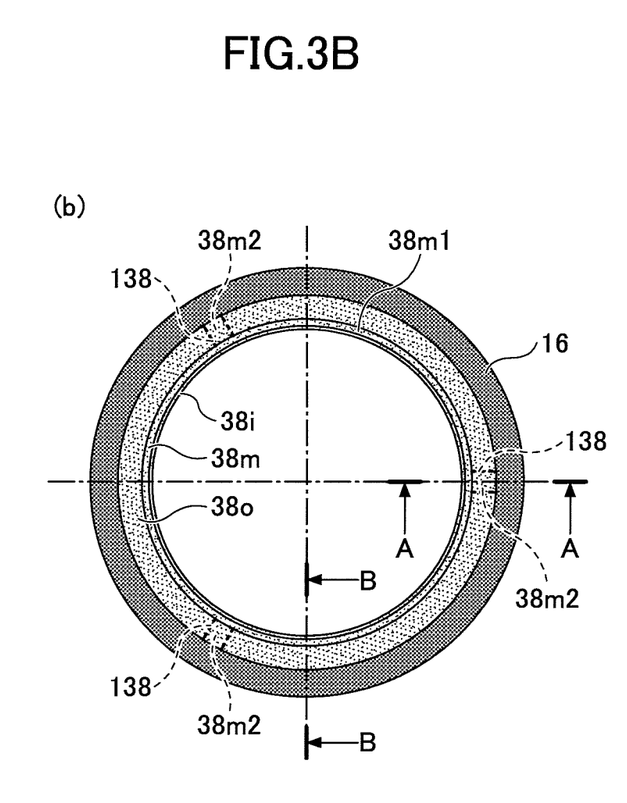
Figure 3C:
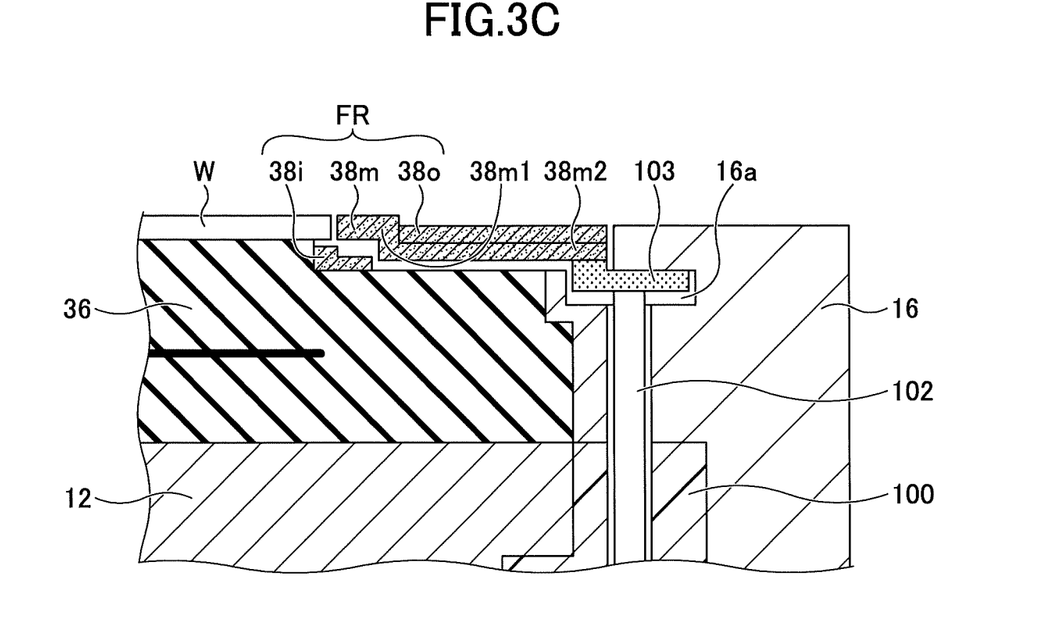
Figure 3D:
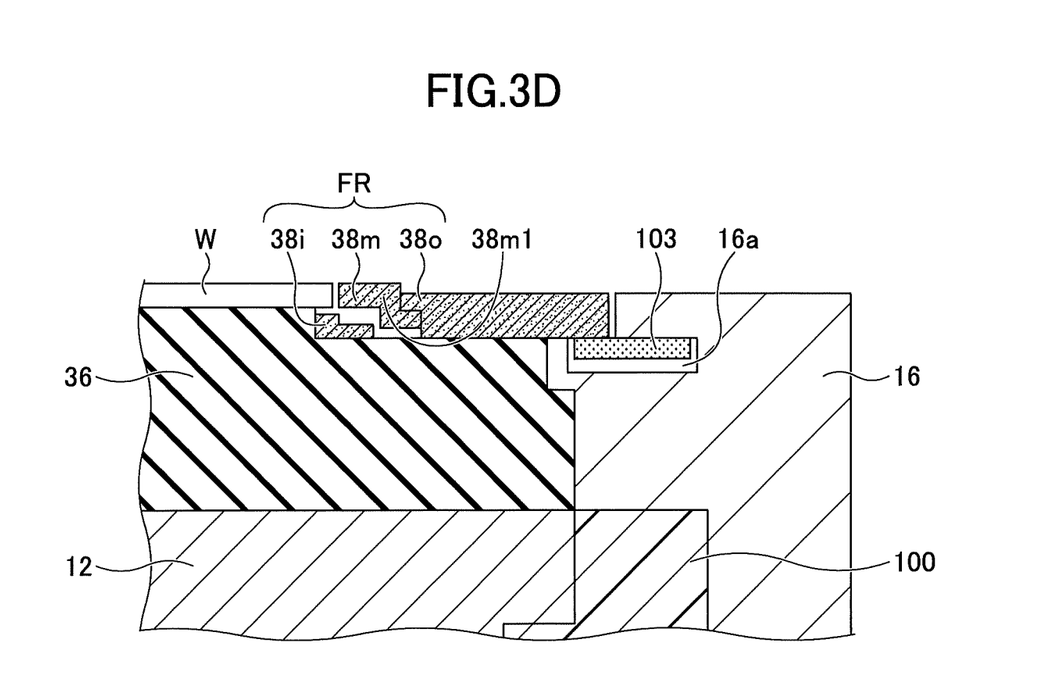

FIG. 3A is a perspective view of the three-piece focus ring FR, FIG. 3B is a plan view of the three-piece focus ring FR, FIG. 3C is a cross-sectional view taken along line A-A of FIG. 3B, and FIG. 3D is a cross-sectional view taken along line B-B of FIG. 3B.

As illustrated in FIG. 2 and FIGS. 3A through 3D, the inner focus ring 38*i* is the innermost component of the focus ring FR and is disposed below the wafer W to surround the outer circumference of the wafer W. The middle focus ring 38*m* is disposed to surround the outside of the inner focus ring 38*i*. The outer focus ring 38*o* is the outermost component of the focus ring FR and is disposed outside of the middle focus ring 38*m*. The inner focus ring 38*i* and the outer focus ring 38*o* are fixed to the upper surface of the electrostatic chuck 36. The middle focus ring 38*m* can be moved by the moving mechanism 200 in the vertical direction.

As illustrated in FIGS. 3A and 3B, the middle focus ring 38*m* includes an annular part 38*m*1 surrounding the circumference of the wafer W and three claws 38*m*2. The claws 38*m*2 are arranged at regular intervals along the outer circumference of the annular part 38*m*1, and have a rectangular shape that protrudes from the outer edge of the annular part 38*m*1. As illustrated in FIG. 2, the vertical cross section of the annular part 38*m*1 has an L-shape. Also, the vertical cross section of the inner focus ring 38*i* has an L-shape. The L-shaped step of the annular part 38*m*1 is in contact with the L-shaped step of the inner focus ring 38*i*, and is moved apart from the L-shaped step of the inner focus ring 38*i* when the middle focus ring 38*m* is lifted.

<Moving Mechanism and Driving Unit>

The claws 38*m*2 of the middle focus ring 38*m* are connected to the annular joint 103. The joint 103 moves in the vertical direction in a space 16*a* formed in the conductive cylindrical support 16.

The moving mechanism 200 moves the middle focus ring 38*m* in the vertical direction. The moving mechanism 200 includes the pusher pin 102 and the coupling 105. The moving mechanism 200 is attached to the housing 100 disposed around the stage 12, and is moved in the vertical direction by the piezo actuator 101 attached to the housing 100. The pusher pin 102 may be formed of sapphire.

The housing 100 is formed of an insulator such as alumina. The housing 100 is disposed inside of the conductive cylindrical support 16 such that the lateral side and the bottom of the housing 100 are adjacent to the inner wall of the conductive cylindrical support 16. A recess 100*a* is formed in a lower inner side of the housing 100. The moving mechanism 200 is provided in the housing 100. The pusher pin 102 passes through the housing 100 and the stage 12 and is in contact with the lower surface of the joint 103 in the space 16*a* formed in the conductive cylindrical support 16. The coupling 105 engages with the connecting part 104*a* provided inside of the housing 100. An O-ring 111 is provided in a pin hole through which the pusher pin 102 passes to separate the vacuum space and the aerial space from each other.

The lower end of the pusher pin 102 is fitted into a recess 105*a* formed in the upper end of the coupling 105. When the coupling 105 is moved up or down via the connecting part 104*a* by the piezo actuator 101, the pusher pin 102 is moved up or down by the coupling 105 and presses the lower surface of the joint 103 upward or lowers the joint 103. As a result, the middle focus ring 38*m* is moved up or down via the joint 103.

The upper end of the piezo actuator 101 is fixed to the connecting part 104*a* with a screw 104*c*, and the lower end of the piezo actuator 101 is fixed to a connecting part 104*b* with a screw 104*d*. Thus, the piezo actuator 101 is fixed to the housing 100 in a position between the connecting parts 104*a* and 104*b*.

The piezo actuator 101 is a positioning device employing a piezoelectric effect, and can perform positioning with a resolution of 0.006 mm (6 μm). The pusher pin 102 moves in the vertical direction a distance corresponding to the amount of displacement of the piezo actuator 101 in the vertical direction. Thus, the middle focus ring 38*m* can be moved in the vertical direction with a minimum unit of 0.006 mm.

As illustrated in FIGS. 3A and 3B, the pusher pin 102 is provided for each of the three claws 38*m*2 arranged at regular intervals along the circumferential direction of the middle focus ring 38*m*. With this configuration, pusher pins 102 press the middle focus ring 38*m* upward to a specified height at three positions via the annular joint 103.

Recesses 138 are formed in the lower surface of the outer focus ring 38*o* at positions above the claws 38*m*2 of the middle focus ring 38*m*. The recesses 138 have a width greater than the width of the claws 38*m*2. When the middle focus ring 38*m* is pressed by the pusher pins 102 to the uppermost position, the claws 38*m*2 enter the recesses 138. This configuration makes it possible to lift the middle focus ring 38*m* without moving the outer focus ring 38*o*.

FIG. 3D is a cross-sectional view taken along line B-B of FIG. 3B, and the recess 138 and the pusher pin 102 are not illustrated in FIG. 3D. FIG. 3D illustrates a state where the annular joint 103 is pressed upward in the space 16*a* formed in the conductive cylindrical support 16 as a result of moving the pusher pin 102 upward.

Referring back to FIG. 2, the piezo actuator 101 is provided for each pusher pin 102 in an internal space of the housing 100 below the pusher pin 102. Thus, three moving mechanisms 200 and three piezo actuators 101 are provided in the housing 100 at positions corresponding to the three pusher pins 102. Each of the connecting parts 104*a* and 104*b* is an annular part, and the upper and lower ends of the piezo actuators 101 are screwed to the connecting parts 104*a* and 104*b*. Thus, the three piezo actuators 101 are connected to each other via the connecting parts 104*a* and 104*b*. In the present embodiment, the piezo actuator 101 is an example of a driving unit.

In the configuration described above, the stage 12 and the electrostatic chuck 36 are supported by the housing 100, and the moving mechanisms 200 and the driving units are attached to the housing 100. This configuration makes it possible to implement a mechanism to move only the middle focus ring 38*m* in the vertical direction without changing the design of the existing electrostatic chuck 36.

Also in the present embodiment, as illustrated in FIG. 2, a space is provided between the upper surface of the electrostatic chuck 36 and the lower surface of the middle focus ring 38*m* so that the middle focus ring 38*m* can be moved not only in the upward direction but also in the downward direction. Thus, the middle focus ring 38*m* can be moved in the space not only in the upward direction but also in the downward direction. This in turn makes it possible to increase the control range of a sheath.

The driving unit is not limited to the piezo actuator 101, and may be implemented by a motor that can be used to control positioning at a resolution of 0.006 mm. The substrate processing apparatus 5 may include one or more driving units. Also, a motor for moving the pusher pin used to lift the wafer W may also be used as the driving unit. In this case, it is necessary to provide a mechanism including gears and a switcher to selectively transfer the motor power to the pusher pins for lifting the wafer W or the pusher pins 102 for moving the middle focus ring 38m and a mechanism to control the vertical movement of the pusher pins 102 at a resolution of 0.006 mm. However, because the middle focus ring 38m to be disposed around the wafer W with a diameter of 300 mm has a large diameter of about 310 mm, it is preferable to provide separate driving units for the respective pusher pins 102 as in the present embodiment.

The controller 74 controls the piezo actuator 101 so that the amount of vertical displacement of the piezo actuator 101 matches the amount of wear of the middle focus ring 38m.

When the heights of the upper surfaces of the wafer W and the focus ring FR are the same, the height of a sheath on the wafer W and the height of a sheath on the focus ring FR during an etching process can be made the same. Making the heights of the sheaths the same makes it possible to improve the in-plane uniformity in the etching rate in the entire wafer W.

Figure 4:
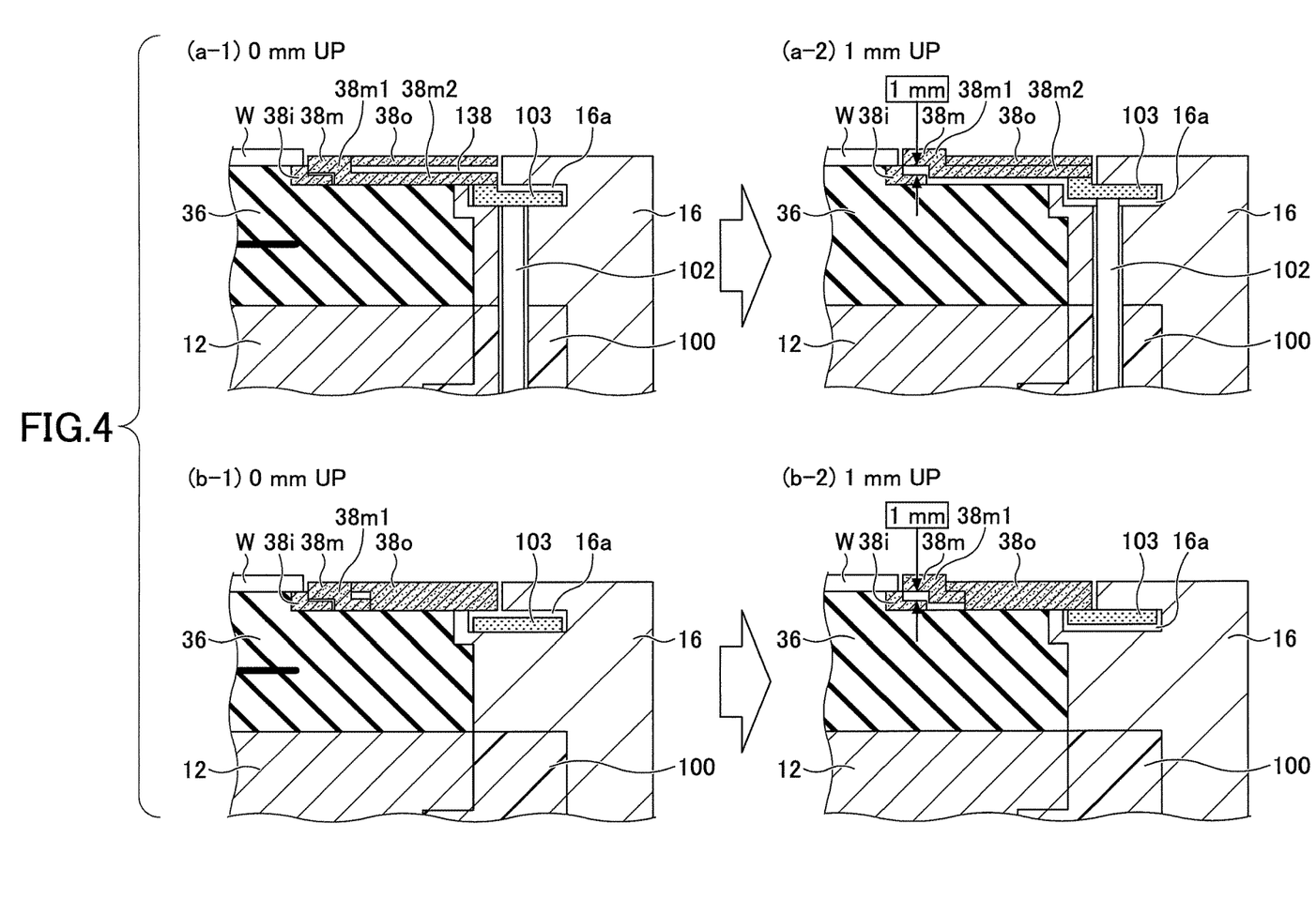
FIG. 4 is a drawing illustrating a vertical movement of a middle focus ring.

When the focus ring FR is brand new, the heights of the sheaths on the wafer W and the focus ring FR during an etching process become the same (flat), and the in-plane etching rate in the entire wafer W becomes uniform. In this case, as illustrated in FIG. 4 (a-1), the middle focus ring 38m is not lifted by the pusher pin 102 (0 mm). FIG. 4 (a-1) is a cross section taken along line A-A of FIG. 3B, and FIG. 4 (b-1) is a cross section taken along line B-B of FIG. 3B.

When the focus ring FR wears as a result of plasma processing such as etching, the height of the sheath on the focus ring FR becomes lower than the height of the sheath on the wafer W. As a result, the etching rate in the edge portion of the wafer W may sharply increase or etching shape tilting may occur. The etching shape tilting indicates a phenomenon where an etching shape, which needs to be vertical, is inclined. The etching shape tilting occurs when the sheath in the edge portion of the wafer W is inclined due to the wear of the focus ring and ions are drawn to the wafer W in a diagonal direction.

In the present embodiment, to prevent the above problems, the middle focus ring 38m is lifted by a distance corresponding to the amount of wear of the focus ring FR so that the heights of sheaths on the wafer W and the focus ring FR become the same. This makes it possible to prevent the etching rate in the edge portion of the wafer W from sharply increasing and prevent the etching shape tilting.

When the amount of wear of the middle focus ring 38m is $\alpha$, a distance $\beta$ that the middle focus ring 38m is lifted by controlling the piezo actuator 101 may be greater than or equal to $\alpha$ and less than or equal to $1.5\alpha$ ($\alpha \leq \beta \leq 1.5\alpha$). For example, the height of the middle focus ring 38m during the processing of the wafer W may be the same as the height of the inner focus ring 38i and the outer focus ring 38o, or may be higher than the height of the inner focus ring 38i and the outer focus ring 38o by a value that is 1.5 times greater than the amount of wear of the middle focus ring 38m at the maximum. The moving mechanism 200 lifts the middle focus ring 38m by a specified distance at a resolution of 0.006 mm.

For example, when the distance is set at a value equal to the amount of wear of the middle focus ring 38m that is 1.0 mm, the distance corresponding to the amount of wear of the middle focus ring 38m is set at 1.0 mm. In this case, the controller 74 drives the piezo actuator 101 to lift the middle focus ring 38m by 1.0 mm. As a result, as illustrated in FIG. 4 (a-2) and FIG. 4 (b-2), the middle focus ring 38m is lifted by 1.0 mm.

Figure 5:
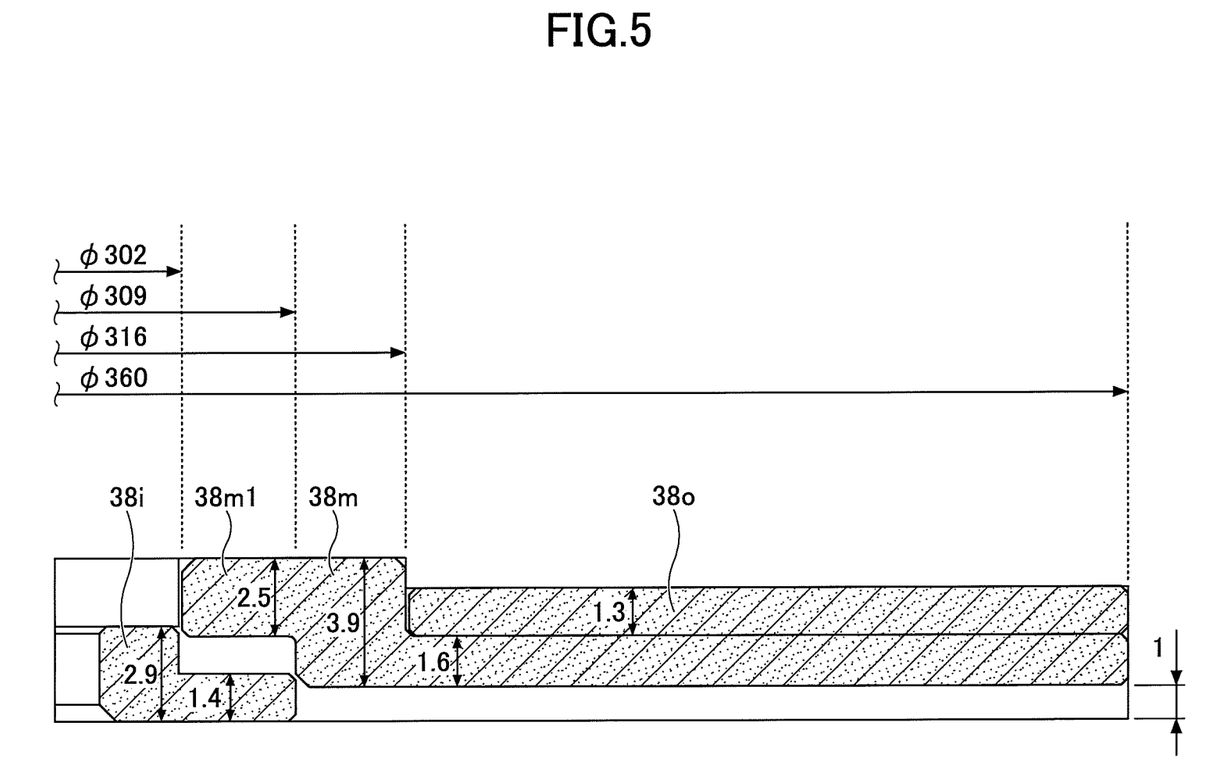
FIG. 5 is a drawing illustrating dimensions of a focus ring.

In the present embodiment, when the focus ring FR is brand new, the components of the focus ring FR have thicknesses as illustrated in FIG. 5. The thicknesses of the inner portion and the outer portion of the inner focus ring 38i are 2.9 mm and 1.4 mm, respectively.

The thicknesses of the central thickest portion, the inner portion, and the outer portion of the middle focus ring 38m are 3.9 mm, 2.5 mm, and 1.6 mm, respectively. The thickness of the outer focus ring 38o is 2.9 mm (=1.3 mm+1.6 mm). However, the thickness of portions of the outer focus ring 38o where the recesses 138 are formed is 1.3 mm.

The maximum distance that the middle focus ring 38m is movable is determined by the stroke of the moving mechanisms 200. In the present embodiment, the stroke of the moving mechanism 200 is 0.9 mm. Accordingly, even if the focus ring FR wears by an amount of 0.9 mm, it is possible to achieve the same etching characteristic that is achievable when the focus ring FR is brand new by moving the moving mechanism 200 up to the maximum distance.

The minimum distance that the middle focus ring 38m is moved is 0.006 mm that corresponds to the resolution of the piezo actuator 101. Thus, when the amount of wear of the middle focus ring 38m becomes greater than or equal to 0.006 mm, the controller 74 of the present embodiment moves the middle focus ring 38m upward by a distance that is a multiple of 0.006 mm and corresponds to the amount of wear. When the total moving distance of the middle focus ring 38m becomes greater than or equal to 0.9 mm, the controller 74 requests replacement of the focus ring FR. However, the maximum moving distance of the middle focus ring 38m is not limited to 0.9 mm and may be set at a value less than 0.9 mm.

<Sizes and Materials>

The diameter of the wafer W is 300 mm. As illustrated in FIG. 5, the outside diameter of the inner focus ring 38i of the present embodiment is 309 mm. The inside diameter and the outside diameter of the annular part 38m1 of the middle focus ring 38m of the present embodiment are 302 mm and 316 mm, respectively. The outside diameter of the outer focus ring 38o of the present embodiment is 360 mm.

However, the outside diameters of the inner focus ring 38i, the middle focus ring 38m, and the outer focus ring 38o are not limited to the values mentioned above. For example, the outside diameter of the inner focus ring 38i may be greater than the outside diameter of the wafer W by 2.5% to 3.5%. Also, the outside diameter of the middle focus ring 38m may be greater than the outside diameter of the wafer W by 4.5% to 5.5%. Further, the outside diameter of the outer focus ring 38o may be greater than the outside diameter of the wafer W by 19.5% to 20.5%.

The material of each of the inner focus ring 38i, the middle focus ring 38m, and the outer focus ring 38o may be selected from Si, $SiO_2$, and SiC. The inner focus ring 38i, the middle focus ring 38m, and the outer focus ring 38o may be formed of the same material or different materials.

However, the material of the middle focus ring 38m is preferably harder than the materials of the inner focus ring 38i and the outer focus ring 38O. For example, $SiO_2$ or SiC that is more wear-resistant than Si is preferably used as the material of the middle focus ring 38m. This makes it possible to improve the wear resistance of the middle focus ring 38m during processing, to prevent changes in the etching rate, and to lengthen the life of the focus ring FR.

For example, it is preferable that the inner focus ring 38i and the outer focus ring 38o are formed of Si and the middle focus ring 38m is formed of $SiO_2$ or SiC.

<Etching Rates>

Figure 6:
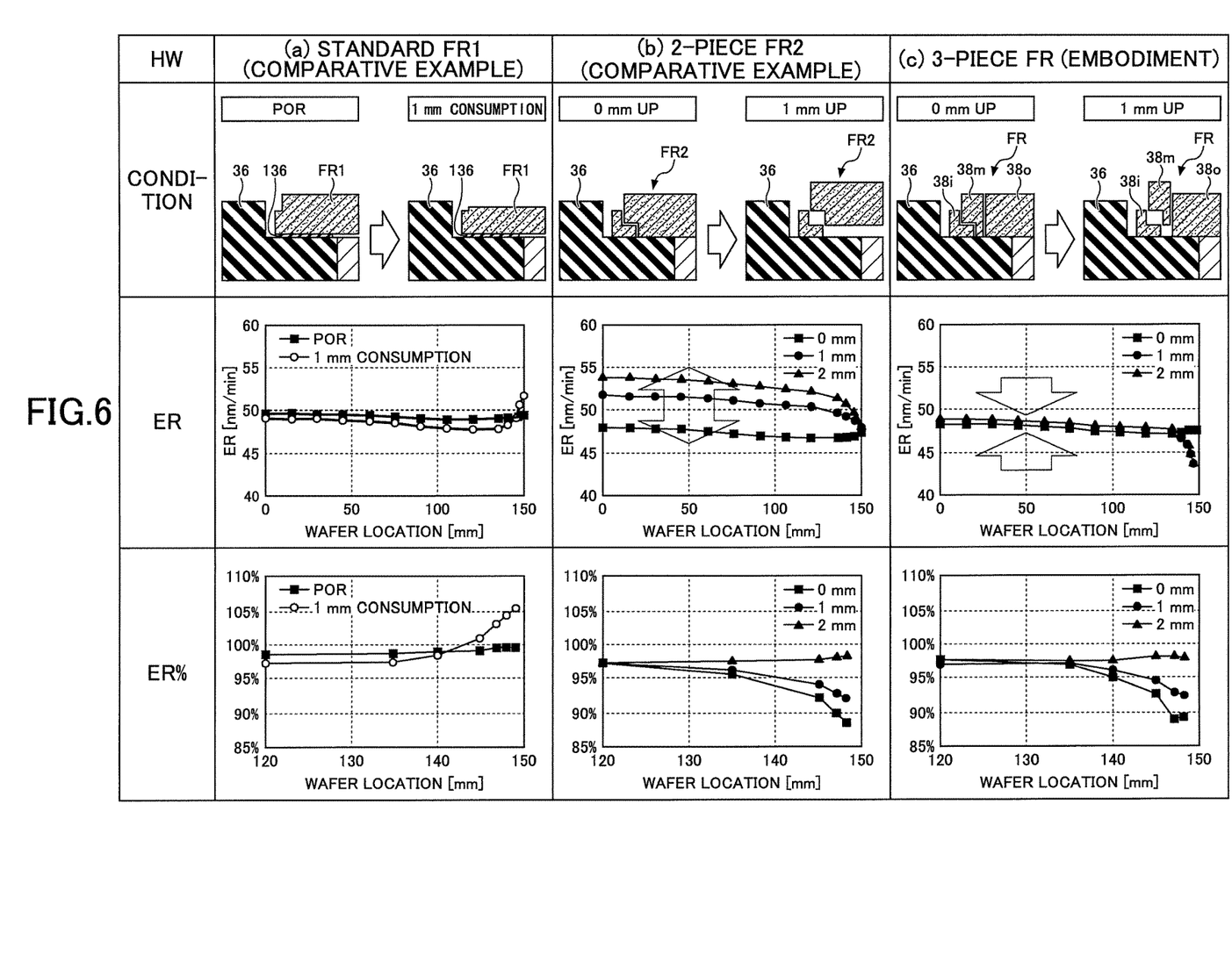
FIG. 6 is a drawing illustrating etching rates observed with focus rings of an embodiment and comparative examples.
Figure 7:
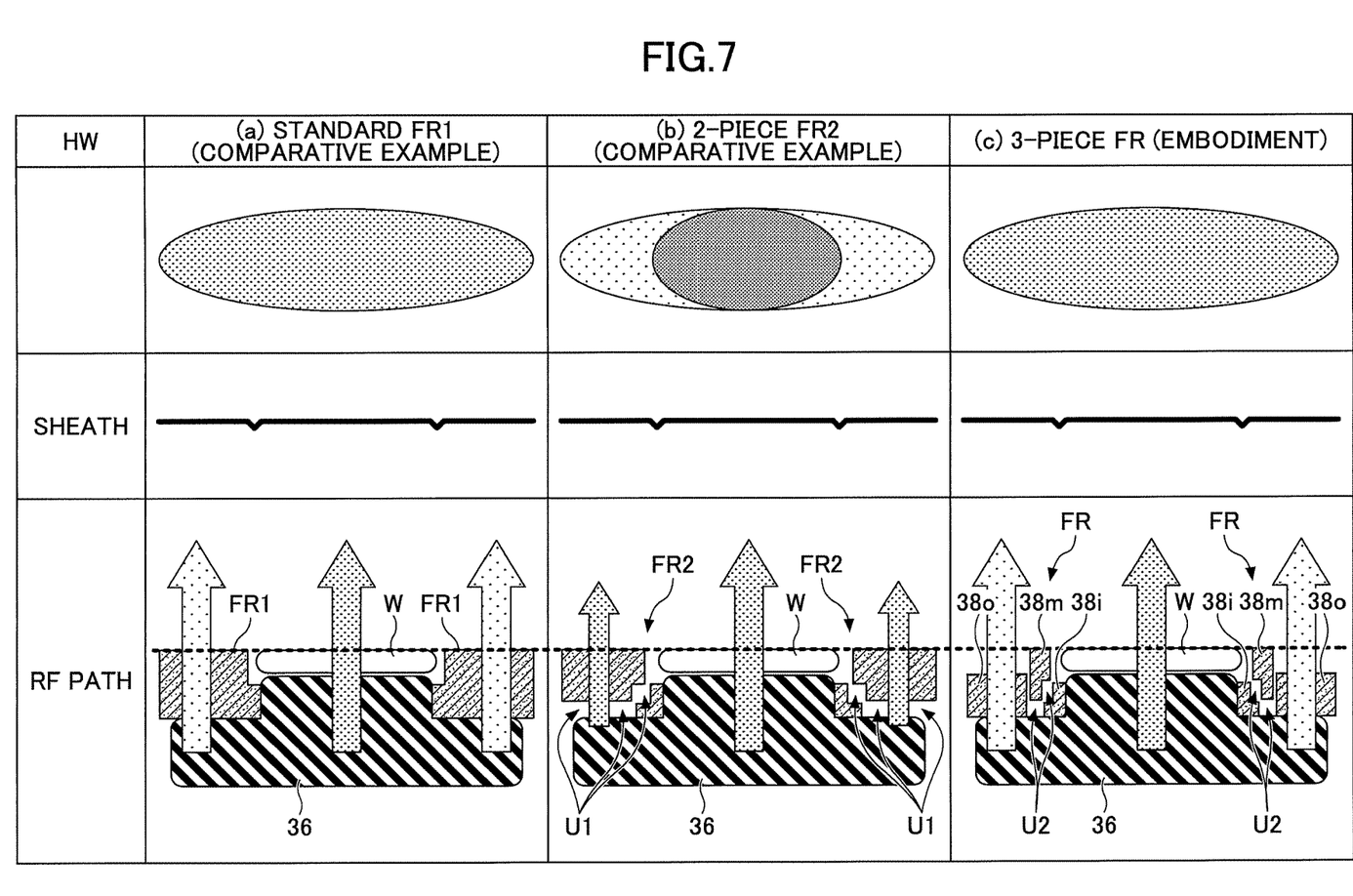
FIG. 7 is a drawing illustrating plasma generation observed with focus rings of an embodiment and comparative examples.

Next, with reference to FIGS. 6 and 7, examples of etching rates observed with the three-piece focus ring FR of the present embodiment are described in comparison with etching rates observed with focus rings of comparative examples. In FIG. 6,(a) illustrates etching rates observed with a focus ring FR1 of a comparative example, (b) illustrates etching rates observed with a focus ring FR2 of a comparative example, and (c) illustrates etching rates observed with the focus ring FR of the present embodiment. In FIG. 7, (a) illustrates plasma generation observed with the focus ring FR1 of the comparative example, (b) illustrates plasma generation observed with the focus ring FR2 of the comparative example, and (c) illustrates plasma generation observed with the focus ring FR of the present embodiment.

The focus ring FR1 (STANDARD FR1) of the comparative example is a single-piece focus ring as illustrated in "HW" (hardware configuration) and "CONDITION". The focus ring FR2 (2-PIECE FR2) of the comparative example is a two-piece focus ring including two components. The focus ring FR (3-PIECE FR) of the present embodiment is a three-piece focus ring including three components.

As illustrated in "CONDITION" of FIG. 6(a), a polymer sheet 136, which is an insulator, is sandwiched between the focus ring FR1 of the comparative example and the electrostatic chuck 36 to facilitate heat conduction between the focus ring FR1 and the electrostatic chuck 36.

In contrast, no polymer sheet is provided between the focus ring FR2 of the comparative example and the electrostatic chuck 36 in FIG. 6(b), and no polymer sheet is provided between the focus ring FR of the present embodiment and the electrostatic chuck 36 in FIG. 6(c). However, it is preferable to provide a polymer sheet between the electrostatic chuck 36 and the inner focus ring 38i and the outer focus ring 38o of the focus ring FR of the present embodiment in FIG. 6(c) to facilitate heat conduction between the focus ring FR and the electrostatic chuck 36.

As illustrated in "ER" (etching rate), in all cases of FIGS. 6(a), (b), and (c), the etching rate is uniform in the entire wafer W when the focus ring is brand new (i.e., POR in FIGS. 6(a) and 0 mm UP in FIGS. 6(b) and (c)).

In contrast, when the amount of wear of the focus ring FR1 of the comparative example in FIG. 6(a) is 1 mm (1 mm CONSUMPTION), the etching rate in the radial direction of the wafer W sharply increases in the edge portion. Thus, with the focus ring FR1, the etching rate in the edge portion of the wafer W is not controllable.

In the focus ring FR2 of the comparative example in FIG. 6(b), the inner focus ring is fixed and only the outer focus ring is moved in the vertical direction. In this case, the sharp increase of the etching rate in the edge portion is prevented. Thus, compared with the focus ring FR1, the focus ring FR2 can better control the etching rate in the edge portion of the wafer W. However, with the focus ring FR2, the etching rate in the entire wafer W shifts greatly when the outer focus ring is lifted 1 mm and 2 mm.

In the focus ring FR of the present embodiment in FIG. 6(c), the inner focus ring 38i and the outer focus ring 38o are fixed and only the middle focus ring 38m is moved in the vertical direction. With this configuration, the etching rate in the edge portion of the wafer W is controlled and the sharp increase of the etching rate in the edge portion is prevented. Also, with the focus ring FR, the etching rate in the entire wafer W does not change greatly even when the middle focus ring 38m is lifted 1 mm and 2 mm.

In graphs in the lowermost row of FIG. 6, it is assumed that the etching rate at the center of the wafer W is the same in the comparative examples and the present embodiment. "ER %" in the lowermost graphs is calculated by a formula "ER(x)/ER(center)×100" where x indicates a position in the radial direction of the wafer W. The lowermost graph in FIG. 6(a) indicates that the etching rate in the edge portion of the wafer W cannot be controlled with the focus ring FR1 of the comparative example. The lowermost graph in FIG. 6(b) indicates that the etching rate in the edge portion of the wafer W can be controlled with the focus ring FR2 of the comparative example. Similarly, the lowermost graph in FIG. 6(c) indicates that the etching rate in the edge portion of the wafer W can be controlled with the focus ring FR of the present embodiment. With the two-piece focus ring FR2 of FIG. 6(b), however, the etching rate in the middle of the wafer W becomes also high and therefore the overall etching characteristic is changed. In contrast, with the three-piece focus ring FR of the present embodiment in FIG. 6(c), the etching rate in the edge portion of the wafer W can be controlled without changing the overall etching characteristic in the entire wafer W.

In the focus ring FR of the present embodiment, the moving distance of the middle focus ring 38m is increased as the amount of wear of the middle focus ring 38m increases. This configuration makes it possible to control the etching rate in the edge portion of the wafer W while maintaining the overall etching characteristic in the entire wafer W. This configuration also makes it possible to suppress the etching shape tilting in the edge portion of the wafer W.

With the configuration of the focus ring FR described above, the wear of the focus ring FR can be compensated for by moving the middle focus ring 38m in the vertical direction by a distance corresponding to the amount of wear of the middle focus ring 38m. This in turn makes it possible to lengthen the life of the focus ring FR.

Next, plasma generation observed with the focus rings FR1 and FR2 of the comparative examples and the focus ring FR of the present embodiment are described with reference FIG. 7. FIG. 7(a) and FIG. 7(b) illustrate the mechanisms of plasma generation when the focus rings FR1 and FR2 of the comparative examples are used.

In FIG. 7, "RF PATH" indicates the flow of the high-frequency power RF in the electrostatic chuck 36 and each of the focus rings FR1, FR2, and FR. When the focus ring FR1 of the comparative example is used and the sheath is flat, substantially the same amount of electric current is caused to flow through the electrostatic chuck 36 in the middle and through the focus ring FR1 at the outer edge, by the high-frequency power HF that is output for plasma generation from the first high-frequency power supply 57, and plasma is generated in the plasma generation space S. As the etching characteristic of the generated plasma, the etching rate sharply increases in the edge portion of the wafer W as the focus ring FR1 wears.

As illustrated in FIG. 7(b), when the focus ring FR2 of the comparative example is used and the sheath is flat, the electric current caused by the high-frequency power RF to flow through the electrostatic chuck 36 is greater than the electric current caused to flow through the focus ring FR2. The reason why this occurs is described below.

A space U1 is formed below the lifted outer focus ring. When the high frequency power RF is applied, capacitance is formed in the space U1. The capacitance formed in the space U1 suppresses the flow of the electric current through the focus ring FR2. Thus, the electric current flows more easily through the electrostatic chuck 36 than through the focus ring FR2. For this reason, compared with the focus ring FR1 in FIG. 7(a), a larger amount of electric current flows through the electrostatic chuck 36, and the density of plasma generated in the middle of the plasma generation space S becomes high. Thus, with the focus ring FR2, the etching rate in the entire wafer W increases as the outer focus ring is lifted higher.

In contrast, with the focus ring FR of the present embodiment illustrated in FIG. 7(c), when the heights of the sheaths on the focus ring FR and the electrostatic chuck 36 are the same, the amounts of electric current caused by the high-frequency power RF to flow through the electrostatic chuck 36 and the focus ring FR become substantially the same.

This is because the focus ring FR of the present embodiment is composed of three components and configured such that only the middle focus ring 38m is lifted and a space U2 with a minimum volume is formed in a position close to the edge portion of the wafer W. This configuration makes it possible to minimize the capacitance formed in the space U2 and to make the amount of electric current flowing through the focus ring FR substantially the same as the amount of electric current flowing through the electrostatic chuck 36. Lifting only the middle focus ring 38m makes it possible to make the heights of sheaths on the focus ring FR and the electrostatic chuck 36 substantially the same without shifting the overall etching rate in the entire wafer W. Thus, the present embodiment makes it possible to control the etching rate in the edge portion of the wafer W.

As described above, the three-piece focus ring FR of the present embodiment is configured such that only the middle focus ring 38m is moved in the vertical direction. This makes it possible to control the etching characteristic in the edge portion of the wafer W without changing the overall plasma etching characteristic in the entire wafer W. This in turn makes it possible to prevent the sharp increase in the etching rate in the edge portion of the wafer W and suppress the etching shape tilting.

<Variation of Focus Ring FR>

A focus ring FR, a moving mechanism 200, and a driving unit according to a variation of the embodiment are described with reference to FIG. 8. Also in the variation, the piezo actuator 101 is used as a non-limiting example of the driving unit.

Figure 8:
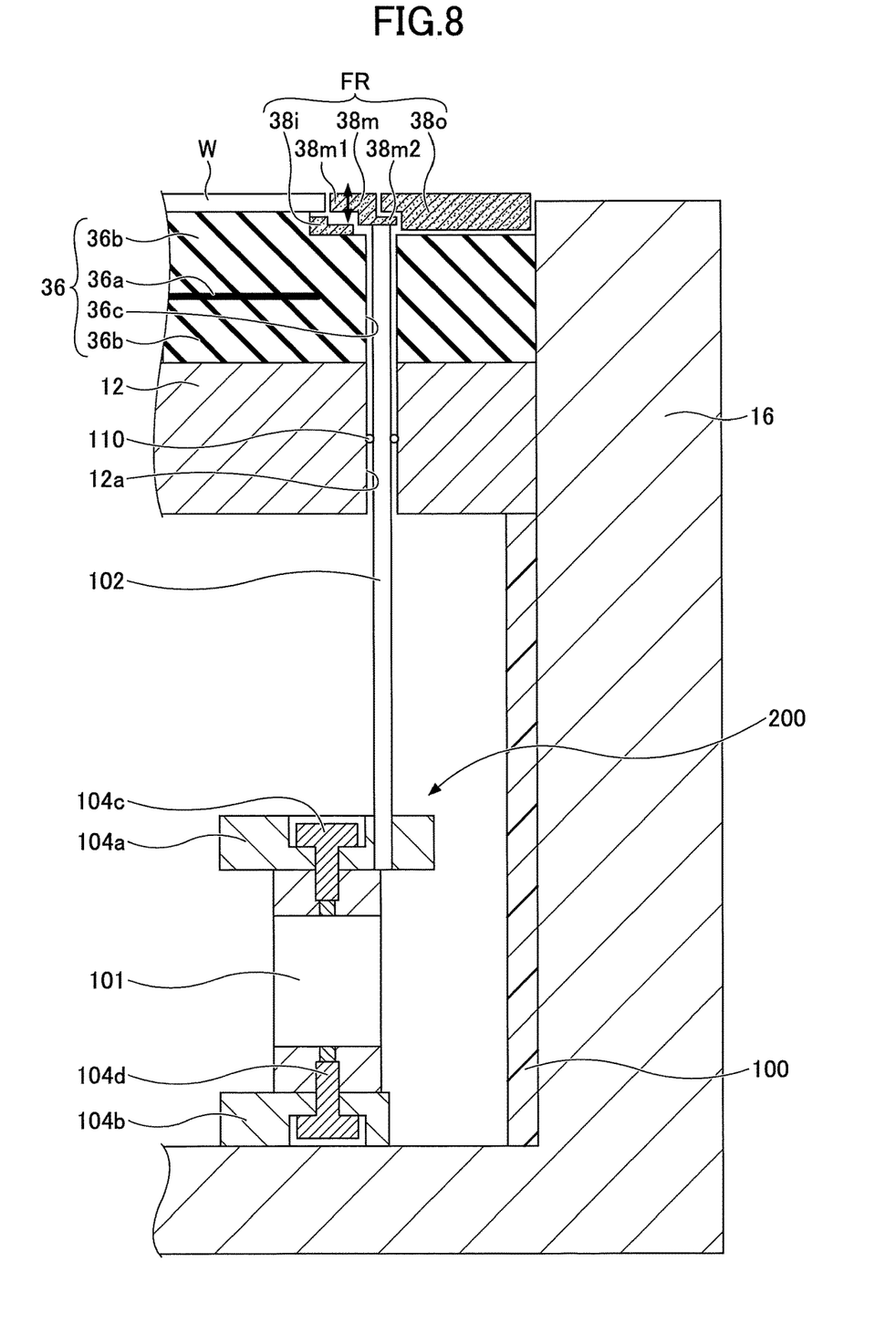
FIG. 8 is a drawing illustrating a focus ring, a moving mechanism, and a driving unit according to a variation.

Compared with the moving mechanism 200 of the embodiment illustrated in FIG. 2, the moving mechanism 200 of the variation illustrated in FIG. 8 is simplified. Also, in the variation, the length of the middle focus ring 38m in the radial direction is shorter than that in the above embodiment.

The stage 12 is supported by a conductive cylindrical support 16 extending vertically upward from the bottom of the chamber 10 and by a housing 100 disposed adjacent to the inner surface of the conductive cylindrical support 16. In the variation, the moving mechanism 200 is disposed below the electrostatic chuck 36 and is not disposed below a part of the conductive cylindrical support 16 facing the outer edge of the electrostatic chuck 36. More specifically, a through hole 36c and a through hole 12a are formed in the electrostatic chuck 36 and the stage 12, respectively, to communicate with each other. An O-ring 110 is provided in the through hole 12a (a pin hole through which the pusher pin 102 passes) to separate the vacuum space and the aerial space from each other.

The pusher pin 102 passes through the through hole 12a and the through hole 36c. An end of the pusher pin 102 is in contact with the lower surface of the middle focus ring 38m and joined to the middle focus ring 38m. Another end of the pusher pin 102 is coupled with the connecting part 104a.

The upper end of the piezo actuator 101 is fixed to the connecting part 104a with a screw 104c, and the lower end of the piezo actuator 101 is fixed to a connecting part 104b with a screw 104d. Thus, the piezo actuator 101 is connected via the connecting part 104a and the pusher pin 102 to the middle focus ring 38m.

With this configuration, the pusher pin 102 moves in the vertical direction by a distance corresponding to the amount of displacement of the piezo actuator 101 in the vertical direction. Thus, the middle focus ring 38m can be moved in the vertical direction with a minimum unit of 0.006 mm.

In this variation, a space is formed between the upper surface of the electrostatic chuck 36 and the lower surface of the middle focus ring 38m. With this configuration, the middle focus ring 38m can be moved in the space not only in the upward direction but also in the downward direction.

In the variation, the moving mechanism 200 is disposed closer to the centers of the electrostatic chuck 36 and the stage 12 than the outer edges of the electrostatic chuck 36 and the stage 12, and the pusher pin 102 passes through the stage 12 and the electrostatic chuck 36. This configuration enables the pusher pin 102 to lift the middle focus ring 38m from a position directly below the middle focus ring 38m.

The configuration of the above variation also makes it possible to make the middle focus ring 38m shorter than the middle focus ring 38m in the embodiment illustrated in FIG. 2. Similarly, the pusher pin 102 is disposed closer to the centers of the electrostatic chuck 36 and the stage 12 than the outer edges of the electrostatic chuck 36 and the stage 12, and the connecting part 104a can be shortened in the radius direction. This makes it possible to minimize the deformation of the middle focus ring 38m and the connecting part 104a, and to improve the positional accuracy of the middle focus ring 38m in the vertical direction. This in turn makes it possible to accurately match the heights of the sheaths on the wafer W and the focus ring FR with each other, to improve the in-plane uniformity in the etching rate in the entire wafer W, and to prevent the etching shape tilting.

Also, the moving mechanism 200 of the variation has a simplified configuration and does not require the housing 100, the coupling 105, and the joint 103 that are included in the moving mechanism 200 of the embodiment illustrated in FIG. 2. This makes it easier to maintain the plasma processing apparatus 5 and makes it possible to reduce the production costs.

Further, in the focus ring FR of the variation, a space is provided below the middle focus ring 38m so that the middle focus ring 38m can be moved not only in the upward direction but also in the downward direction.

Thus, similarly to the embodiment of FIG. 2, the minimum moving distance of the middle focus ring 38m corresponds to the resolution of the piezo actuator 101. The maximum moving distance of the middle focus ring 38m is less than a value obtained by adding the height of the space provided between the upper surface of the electrostatic chuck 36 and the lower surface of the middle focus ring 38m to the thickness of the middle focus ring 38m. This makes it possible to move the middle focus ring 38m not only in the upward direction but also in the downward direction and to increase the control range of a sheath.

The focus ring FR of the variation is shorter in the radial direction than the focus ring FR of the embodiment illustrated in FIG. 2, and therefore, the claws 38m2 are shorter than those in the embodiment. This makes it possible to reduce the singularity in capacitance that is caused by the protruding structure of the claws 38m2, to reduce or eliminate the adverse effect of the singularity in capacitance on the etching characteristic, and to further improve the uniformity in the etching rate.

In the embodiment and the variation described above, the peak height of the upper surface of the middle focus ring 38m during processing may be greater than or equal to the peak heights of the upper surfaces of the inner focus ring 38i and the outer focus ring 38o.

A substrate processing apparatus according to an embodiment is described above. However, the present invention is not limited to the above-described embodiment, and variations and modifications may be made without departing from the scope of the present invention. Also, embodiments and variations may be combined as long as they do not conflict with each other.

For example, although the high-frequency power RF is applied in the above embodiment, a direct current (DC) may instead be applied.

The present invention may be applied not only to a parallel-plate two-frequency applying apparatus illustrated in FIG. 1 but also to other types of substrate processing apparatuses. Examples of substrate processing apparatuses include a capacitively-coupled plasma (CCP) apparatus, an inductively-coupled plasma (ICP) processing apparatus, a plasma processing apparatus using a radial line slot antenna, a helicon wave plasma (HWP) apparatus, an electron cyclotron resonance (ECR) plasma apparatus, and a surface-wave plasma processing apparatus.

Also, the substrate processing apparatus may be an apparatus that processes a substrate using, for example, heat and without using plasma. The substrate processing apparatus may either include the electrostatic chuck 36 or not include the electrostatic chuck 36.

Although the semiconductor wafer W is used as an example of an object to be processed in the present application, the object is not limited to the wafer W. For example, the object may also be a board used for a liquid crystal display (LCD) or a flat panel display (FPD), a photomask, a CD substrate, or a printed-circuit board.

An aspect of this disclosure makes it possible to control the processing characteristic in an edge portion of a substrate while maintaining the overall processing characteristic in the entire substrate.

What is claimed is:

1. A substrate processing apparatus, comprising:
   a process chamber;
   a stage that is disposed in the process chamber;
   an electrostatic chuck on which a substrate is placed, the electrostatic chuck including an insulator and being disposed on the stage;
   a joint;
   a pusher pin that is connected to a lower surface of the joint;
   a focus ring that includes
      an inner focus ring disposed close to the substrate placed on the electrostatic chuck,
      a middle focus ring that is disposed outside of the inner focus ring, and
      an outer focus ring that is disposed outside of the middle focus ring and has an upper surface area greater than an upper surface area of the middle focus ring, and
   a controller; wherein
   the middle focus ring includes an annular part and rectangular parts, the rectangular parts being disposed below the outer focus ring and protruding outward from an outer edge of the annular part;
   the rectangular parts are provided on the annular part; the outer focus ring includes recesses that are formed in a lower surface of the outer focus ring and face the corresponding rectangular parts of the middle focus ring;
   the joint is connected to outer ends of the rectangular parts of the middle focus ring;
   the pusher pin is configured to move the joint in a vertical direction and move the middle focus ring in the vertical direction via the joint;
   the inner focus ring, the middle focus ring, and the outer focus ring are disposed on or above an outer region of an upper surface of the electrostatic chuck, the outer region being on an outer side from a step formed on the upper surface of the electrostatic chuck in a radial direction;
   the pusher pin is disposed outside of outer edges of the electrostatic chuck, the inner focus ring, the middle focus ring, and the outer focus ring;
   the rectangular parts of the middle focus ring overlap the outer focus ring in a plan view; and
   the controller configured to cause the pusher pin to move the middle focus ring such that a gap between the rectangular parts of the middle focus ring and the outer focus ring narrows and such that the rectangular parts mate with the recesses.

2. The substrate processing apparatus as claimed in claim 1, further comprising:
   a driving unit that moves the pusher pin in the vertical direction,
   wherein the pusher pin is configured to move the middle focus ring in the vertical direction by a distance that corresponds to an amount of displacement of the driving unit in the vertical direction.

3. The substrate processing apparatus as claimed in claim 2, further comprising:
   a housing that is disposed around the stage and houses the pusher pin and the driving unit.

4. The substrate processing apparatus as claimed in claim 1, further comprising:
   a housing that is disposed around the stage and houses the pusher pin;
   a plurality of driving units that are disposed in the housing and move the pusher pin in the vertical direction; and
   a connecting part that connects the driving units to each other,
   wherein the driving units are attached to the housing via the connecting part.

5. The substrate processing apparatus as claimed in claim 2, wherein
   a minimum distance that the middle focus ring is movable corresponds to a resolution of the driving unit; and
   a maximum distance that the middle focus ring is movable is less than a thickness of the middle focus ring.

6. The substrate processing apparatus as claimed in claim 1, further comprising:
   a driving unit that moves the pusher pin in the vertical direction,
   wherein the pusher pin passes through the stage and is disposed closer to a center of the stage than an outer edge of the stage.

7. The substrate processing apparatus as claimed in claim 1, further comprising:
   a plurality of driving units that move the pusher pin in the vertical direction; and a connecting part that connects the driving units to each other, wherein the pusher pin passes through the stage and is disposed closer to a center of the stage than an outer edge of the stage; and the driving units are connected to the pusher pin via the connecting part.

8. The substrate processing apparatus as claimed in claim 6, wherein
a minimum distance that the middle focus ring is movable corresponds to a resolution of the driving unit; and
a maximum distance that the middle focus ring is movable is less than a value obtained by adding a height of a space formed between an upper surface of the stage and a lower surface of the middle focus ring to a thickness of the middle focus ring.

9. The substrate processing apparatus as claimed in claim 1, wherein the pusher pin comprises sapphire.

10. The substrate processing apparatus as claimed in claim 1,
wherein the pusher pin passes through the stage and the electrostatic chuck; and
a space is formed between an upper surface of the electrostatic chuck and a lower surface of the middle focus ring.

11. The substrate processing apparatus as claimed in claim 5, wherein the resolution of the driving unit is 0.006 mm.

12. The substrate processing apparatus as claimed in claim 2, wherein the driving unit is a piezo actuator.

13. The substrate processing apparatus as claimed in claim 1, wherein a peak height of an upper surface of the middle focus ring during processing in the process chamber is higher than peak heights of upper surfaces of the inner focus ring and the outer focus ring.

14. The substrate processing apparatus as claimed in claim 1, wherein the inner focus ring, the middle focus ring, and the outer focus ring are formed of a same material or different materials.

15. The substrate processing apparatus as claimed in claim 1, wherein each of the inner focus ring and the outer focus ring is formed of one of Si, SiO2, and SiC.

16. The substrate processing apparatus as claimed in claim 1, wherein the middle focus ring is formed of a material that is harder than a material of the inner focus ring and the outer focus ring.

17. The substrate processing apparatus as claimed in claim 1, wherein an outside diameter of the inner focus ring is greater than an outside diameter of the substrate by 2.5% to 3.5%.

18. The substrate processing apparatus as claimed in claim 1, wherein an outside diameter of the middle focus ring is greater than an outside diameter of the substrate by 4.5% to 5.5%.

19. The substrate processing apparatus as claimed in claim 1, wherein an outside diameter of the outer focus ring is greater than an outside diameter of the substrate by 19.5% to 20.5%.

20. The substrate processing apparatus as claimed in claim 1, wherein
lower surfaces of the inner focus ring, the middle focus ring, and the outer focus ring are disposed at a same height; and
the pusher pin is configured to move only the middle focus ring among the inner focus ring, the middle focus ring, and the outer focus ring in the vertical direction.

21. The substrate processing apparatus as claimed in claim 1, wherein the joint extends to a position outside of an outer edge of the outer focus ring.

22. The substrate processing apparatus as claimed in claim 1, wherein the joint has an annular shape.

23. The substrate processing apparatus as claimed in claim 1, wherein when the joint is moved upward by the pusher pin and the middle focus ring is moved upward by the joint, the rectangular parts enter the at least three recesses of the outer focus ring.

24. The substrate processing apparatus as claimed in claim 1, further comprising:
a conductive cylindrical support disposed around the stage,
wherein the joint is disposed in a space formed in the conductive cylindrical support.

25. The substrate processing apparatus as claimed in claim 24, wherein the pusher pin passes through the conductive cylindrical support.

* * * * *